United States Patent
Wang et al.

(10) Patent No.: US 12,224,082 B2
(45) Date of Patent: Feb. 11, 2025

(54) STRESS ENGINEERED MICROSPRING FOR CRYOGENIC SUPERCONDUCTING CIRCUITS

(71) Applicant: PALO ALTO RESEARCH CENTER INCORPORATED, Palo Alto, CA (US)

(72) Inventors: Qian Wang, Mountain View, CA (US); Christopher L. Chua, San Jose, CA (US); Yu Wang, Union City, CA (US); Eugene M. Chow, Palo Alto, CA (US)

(73) Assignee: Xerox Corporation, Orwalk, CT (US)

( * ) Notice: Subject to any disclaimer, the term of this patent is extended or adjusted under 35 U.S.C. 154(b) by 204 days.

(21) Appl. No.: 18/107,575

(22) Filed: Feb. 9, 2023

(65) Prior Publication Data

US 2024/0274325 A1   Aug. 15, 2024

(51) Int. Cl.
*H01B 12/02* (2006.01)
*H10N 60/80* (2023.01)

(52) U.S. Cl.
CPC ............. *H01B 12/02* (2013.01); *H10N 60/80* (2023.02)

(58) Field of Classification Search
CPC ................................ H01B 12/02; H10N 60/80
USPC ...................................................... 174/125.1
See application file for complete search history.

(56) References Cited

U.S. PATENT DOCUMENTS

| | | | |
|---|---|---|---|
| 6,290,510 B1 * | 9/2001 | Fork | G01R 3/00 257/E23.068 |
| 7,247,895 B2 * | 7/2007 | Liu | G01Q 70/06 257/444 |
| 7,654,833 B2 * | 2/2010 | Fork | H01R 13/03 29/874 |
| 9,955,575 B1 | 4/2018 | Wang et al. | |
| 11,201,275 B1 * | 12/2021 | Chua | H10N 60/83 |
| 11,527,420 B2 | 12/2022 | Chua et al. | |
| 2003/0071330 A1 * | 4/2003 | Romano | G01R 1/06727 439/666 |
| 2003/0096519 A1 * | 5/2003 | Fork | H05K 3/4092 438/117 |
| 2006/0038643 A1 * | 2/2006 | Xu | G11C 23/00 335/78 |
| 2007/0125486 A1 * | 6/2007 | Hantschel | B81C 1/00952 156/163 |
| 2011/0167526 A1 * | 7/2011 | Chow | B81C 1/0015 977/773 |
| 2022/0301891 A1 * | 9/2022 | Chua | H01L 23/53252 |

* cited by examiner

*Primary Examiner* — Timothy J Thompson
*Assistant Examiner* — Michael F McAllister
(74) *Attorney, Agent, or Firm* — Mueting Raasch Group

(57) ABSTRACT

A microspring includes a film stack having a base disposed on a build plane and a spring member extending from the base. The film stack includes a compressive layer, a substantially stress-free layer, and a tensile layer. The film stack is formed of one or more materials that become superconducting below 140 K. A stress gradient in the film stack causes the spring member to curl away from the build plane of the base.

20 Claims, 11 Drawing Sheets

STRESS ENGINEERED MICROSPRING FOR CRYOGENIC SUPERCONDUCTING CIRCUITS

SUMMARY

The present disclosure is directed to a stress engineered microspring for cryogenic superconducting circuits. In one embodiment, a microspring includes a film stack having a base disposed on a build plane and a spring member extending from the base. The film stack includes, in order from the build plane, a compressive layer, a substantially stress-free layer, and a tensile layer. The film stack is formed of one or more materials that become superconducting below 140 K. A stress gradient in the film stack causes the spring member to curl away from the build plane of the base.

In another embodiment, a microspring is disposed on a build plane and includes a film stack with a base and a spring member extending from the base. The film stack includes, in order from the build plane: a compressive layer having a first thickness; a substantially stress-free layer having a second thickness; and a tensile layer having a third thickness. The second thickness is greater than the first and third thicknesses. A stress gradient in the film stack causes the spring member to curl away from the build plane of the base.

In another embodiment, a method involves depositing a sacrificial release layer over a substrate. A film stack is deposited over the sacrificial release layer in a build plane. The film stack includes a compressive layer proximate the substrate, a tensile layer spaced from the substrate, and a substantially stress-free layer disposed between the compressive and tensile layers. The film stack is formed of one or more materials that become superconducting below 140 K. The film stack is patterned to define a microspring structure in the build plane. The microspring structure includes a base and a spring member extending from the base. A portion of the sacrificial release layer located under the spring member is removed, such that stress within the film stack causes the spring member to curl out of the build plane.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
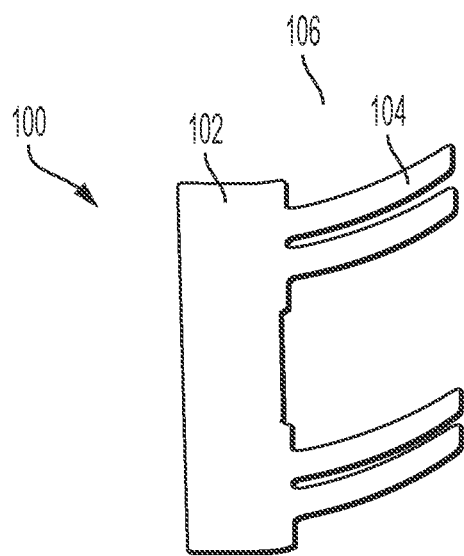
FIG. 1 is a diagram of a micro-spring according to an example embodiment.
Figure 2:
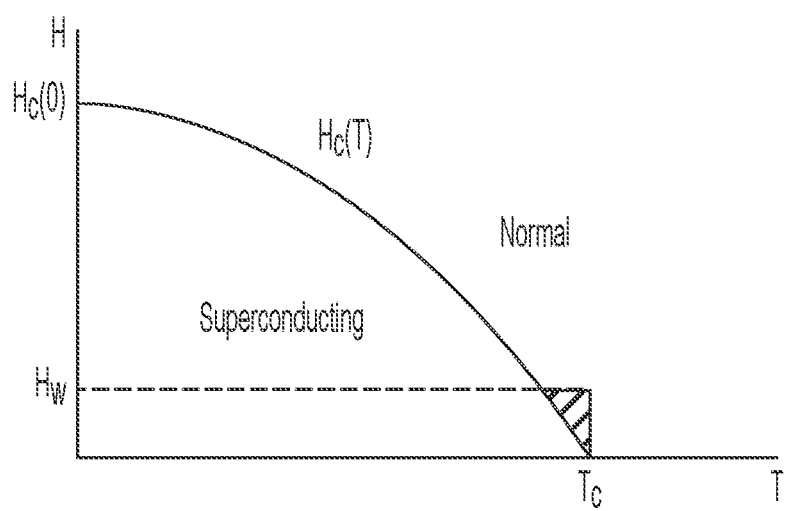
FIG. 2 is a plot showing effects of magnetic fields on performance of a superconductive connector according to example embodiments.

The present disclosure is generally related to the fabrication and use of micrometer scale electrical interconnects. As devices have become smaller and ICs more complex, it has become difficult to achieve design targets for some devices using conventional circuit board attachment of integrated circuits (ICs), such as flip-chip mounting. Flip-chip involves mating the surfaces of two chips such that conductive pads on the mating surface of both chips are aligned. A reflow operation is performed which bonds the IC to the board and establishes the electrical connections between the pads.

Among the advantages of flip-chip assembly is the ability to form compact final assemblies with short signal lines, and adaptability to high-speed assembly processes. Flip-chip bonding has some disadvantages, though. Such assemblies are not well-suited for easy replacement, or unaided manual installation. The short connections formed by the bonded pads are very stiff, so if the thermal expansion of the chip is not well matched to the supporting board, the connections can fracture. Also, if the mounting surfaces are not sufficiently flat, some connections may fail to bond due to insufficient contact between the pads.

In order to provide the advantages of flip-chip assembly and counter some of the disadvantages, a system has been developed to use non-soldered connections in a flip-chip style assembly. This involves forming conductive springs that extend out of the pads of a mounting surface and/or IC. These springs can be formed at micrometer scale, e.g., extending between 1 and 10 μm from the surface, with connector pitch at a similar scale. This can result in a multi-chip module assembly that is compact with short conductor runs, yet can still be assembled and reworked more easily than a bonded assembly. The flexible springs are more forgiving of variation in surface flatness thus is less likely to experience mechanical stress if the mated devices have different rates of thermal expansion.

In order to fabricate springs at such a small scale, techniques have been developed to use wafer production processes to form micro-scale springs on wafer substrates. For example, U.S. Pat. No. 9,955,575, dated Apr. 24, 2018, describes methods for producing out of plane structures that can be used in microelectronic circuits. Generally, a film is deposited with stress engineered layers (e.g., molybdenum-chromium or MoCr) onto an electronic device. The film has elastic portions with a non-uniform stress profile through its thickness such that the stress engineered film curls upward when one end is released, e.g., via undercut etching the end while keeping another end of the film anchored.

Stress-engineered, microfabricated, springs (also referred to herein as "microsprings") have been successfully incorporated into many conventional electronic multichip designs. For example, various shapes of high-density MoCr sandwich microsprings and micro-coils have been developed and fabricated successfully for application such as chip test and chip-to-chip interconnection.

There has been an increased interest in developing electronics that take advantage of superconductivity. A superconductive material conducts electrical current without resistive energy loss when cooled below a critical temperature. Superconductive materials have found uses in applications such as electromagnets and digital circuitry. As an example of the latter, quantum computing devices (e.g., rapid single flux quantum) are being developed that use superconductive circuit elements. These devices operate in a cryogenic environment, e.g., below 140 K.

Niobium (Nb) and niobium alloys are widely used as superconductor trace lines in cryogenic environment. Microfabricated MoCr alloy springs integrated with superconductive Nb thin film provide 3D-assembled package solution of high-density interposal connection for superconducting integrated circuits which are key components of cryogenic electronics and quantum computers. However, Cr is an antiferromagnetic material where magnons could couple strongly to the conduction electrons in adjacent metals. Quantum computing electronics relies on the single flux quantum for setting up qubit and coupler operation. Any stray magnetic flux in the chip cooled down into the cryogenic range will be trapped inside the circuit and cause it fail. Thus, MoCr-free superconductor micro springs are desired in those superconductor electronic applications.

Embodiments described herein include stress-engineered niobium microsprings without the use of MoCr film, and methods for the fabrication of same. By adjusting the parameters of sputtering process for Nb films, a set of stacked Nb layers with gradient stress can be formed on substrates with a scarified layer. The microsprings and microfabrication processes enable building Nb-based microsprings structures which are comparable to MoCr-based microsprings. The fabrication processes of Nb-based microsprings are in wafer scale and compatible with superconductor integrated circuits chips. It is demonstrated that the stress-engineered Nb film shows superconductor performance below critical temperatures of ~9K.

In FIG. 1, a line drawing based on a scanning electron micrograph (SEM) image that shows a fabricated microspring 100 according to an example embodiment. The microspring 100 includes a film stack configured to include a base 102 disposed on a build plane 106 and a spring member 104 extending from the base 102. A stress gradient in the film stack causes the spring member 104 to curl away from the build plane 106. As will be described in greater detail below, the film stack includes, in order from the build plane 106, a compressive layer, a substantially stress-free layer, and a tensile layer. The film stack is formed of one or more materials that become superconducting below 140 K, and is free from magnetic materials, e.g., antiferromagnetic material such as Cr.

Niobium is an example of a type II superconductor which superconductor performance was affected by applied critical magnetic field ($H_c$) when cooled down below critical temperature ($T_c$). As seen in the shaded region in the graph of FIG. 3, a weak magnetic field $H_w$ around $T_c$ could change the superconductivity to normal conductivity. Thus, a magnetic material such as Cr near to an Nb layer could prevent desired superconductive behavior of the Nb layer. For example, a currently implemented very large scale integration (VLSI) processes for superconductor electronics includes as many as eight layers of Nb wires. Thus, a magnetic material free microsprings are preferred or desired to eliminate uncertain effect on those Nb layers when the microsprings are integrated with a superconductor VLSI.

A method has been developed that enables direct fabrication of gold (Au) and Nb sandwich microsprings on dielectric, film-coated, silicon (Si) substrates. This demonstrates that the fabrication process of the microsprings can applied on most any integrated circuit wafer, which are commonly formed of Si. In example embodiments described herein, gradient stress is formed in sputtering-deposited Nb film. It is known that the intrinsic stress in Nb film is related to the pressure in the deposition.

Figure 3:
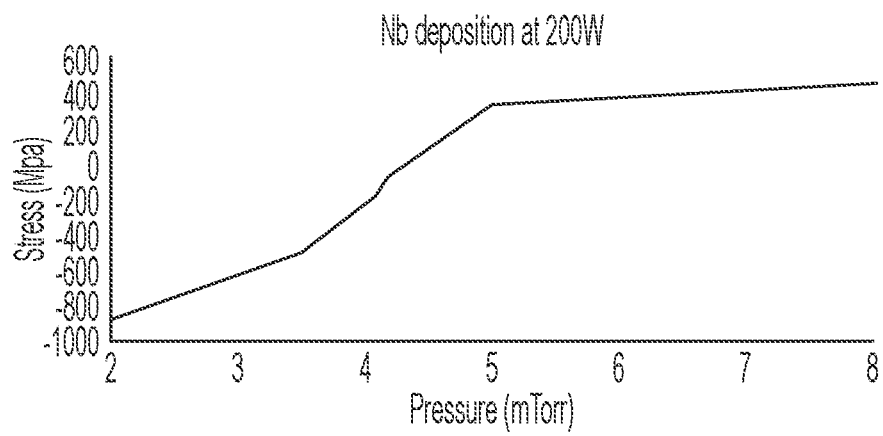
FIG. 3 is a plot showing effects of deposition chamber pressure on intrinsic stress for a material used in a microspring according to an example embodiment.

In FIG. 3, a graph shows the dependence of Nb-film intrinsic stress on the deposition pressure on the sputter system. It is found that deposition at low pressure (e.g., ~2 mTorr) forms Nb film with compressive stress as high as ~900 MPa and deposition at high pressure (e.g., ~8 mTorr) forms Nb film with tensile stress as high as ~500 MPa. A substantially stress free Nb film could be deposited at ~4 mTorr.

For purposes of this disclosure, a substantially stress free layer is considered a layer with a compressive or tensile intrinsic stress that is a fraction of at least one of (e.g., the lowest of) the maximum intrinsic tensile or compressive stress in an adjacent layer. For example, given that the maximum tensile stress (e.g., that is feasibly-obtainable given chamber pressure limits) in Nb is ~500 MPa, a substantially stress free layer may have an intrinsic compressive or tensile stress less than 5% this maximum, or <25 MPa. Other fractional values may be used, e.g., <10%. Further, the substantially stress-free layer may be slightly biased in some embodiments to be slightly compressive or tensile in order to counteract asymmetric intrinsic stress profiles of the material. In the Nb example shown in FIG. 3, the material is biased to form higher compressive stress than tensile stress within the given deposition pressure range, so this asymmetry may be balanced by forming the substantially stress free layer in conditions that result in the layer having a small tensile stress that is below a threshold.

Figure 4:
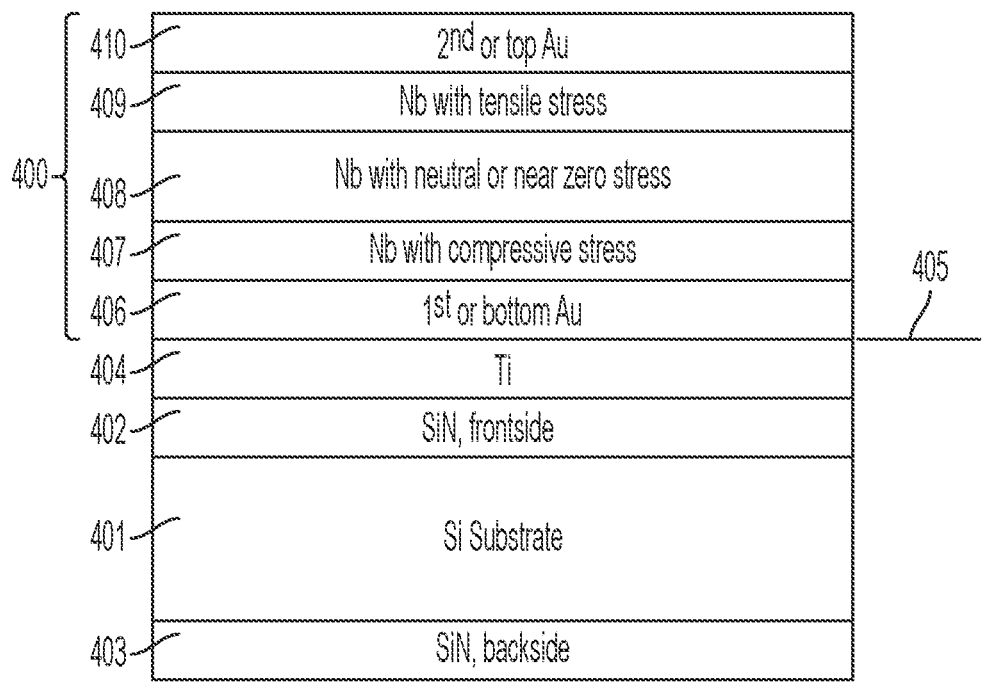
FIG. 4 is a block diagram of a material stack for a microspring according to an example embodiment.

Using the information shown in FIG. 3, a stacked Nb film with gradient stress can be deposited continually by adjusting the chamber pressure in a sputtering process, resulting in a structure that will be biased away from a build surface once part of the structure is released while another part remains affixed to the build surface. In FIG. 4, a block diagram shows an example of a thin film stack 400 used to form a structure according to an example embodiment.

The thin film stack 400 is formed on a substrate 401 (e.g., Si) that is coated with a passivation layers 402, 403 on either side, which may also be considered as diffusion barriers. In this example, the passivation layers are silicon nitride (SiN). The Si may be a bare wafer or prefabricated integrated circuit, e.g., a prefabricated superconductive quantum computing device. A release layer 404 is formed on an exposed surface of the top/frontside layer 402 the build surface. The release layer 404 may be formed of a metal, e.g., titanium (Ti), that can be etched away to release parts of the microspring structures. An exposed surface of the release layer 404 acts as a build surface 405 for the structure 400.

The structure 400 includes a first/bottom conductive layer 406 (here Au), a compressive layer 407, a substantially stress-free layer 408, a tensile layer 409, and a second/top conductive layer 410 (also Au in this example). The layers 407-409 are shown as discrete layers, although there may be a smooth transition between the layers 407-409, e.g., if the chamber pressure is slowly changed during deposition. Through optimization of parameters of film such as stress and thickness and proper dimension and shape in the design, the microsprings with desired lift height could be fabricated with microfabrication processes and the structure illustrated in FIG. 4.

After formation of layers as shown in FIG. 4, the microsprings can be formed using techniques similar to those used for the fabrication of MoCr microsprings. Those microfabrication technologies including photo lithography to define spring shapes and wet/dry etching of metals (e.g., release layer 404) to release ends of the microsprings. These microsprings can be formed on a blank wafer or a wafer that already has integrated circuits and/or other devices formed thereon.

Note that while example embodiments described herein are shown using Nb films, other film materials may be used that become superconducting below 140 K. Those materials include, but are not limited to, Al, In, Pb, Sn, Ta, Tc, $C_6Ca$, $C_6Li_3Ca_2$, $Nb_3Ge$, NbCN, $Nb_3Sn$, NbTi, $Cu_xO_y$, and ZrN. In these examples, Nb films are shown as a microspring material because Nb alloys are widely used as superconductive traces in microcircuits. Further, while the example embodiments show microsprings with Au top and bottom layers, other metals may be used for metal top and bottom layers, such as platinum (Pt), silver (Ag), rhenium (Re), ruthenium (Ru), rhodium (Rh), palladium (Pd), osmium (Os), and iridium (Ir), copper (Cu), etc. Similarly, in embodiments described herein a Ti layer is shown using in a sacrificial release layer. other metals may be used, such as a Ti alloy or $Si_xO_yN_z$, where and x, y, and z are fractional constituents between 0 and 1 and x, y, and z sum to 1.

Figure 5:
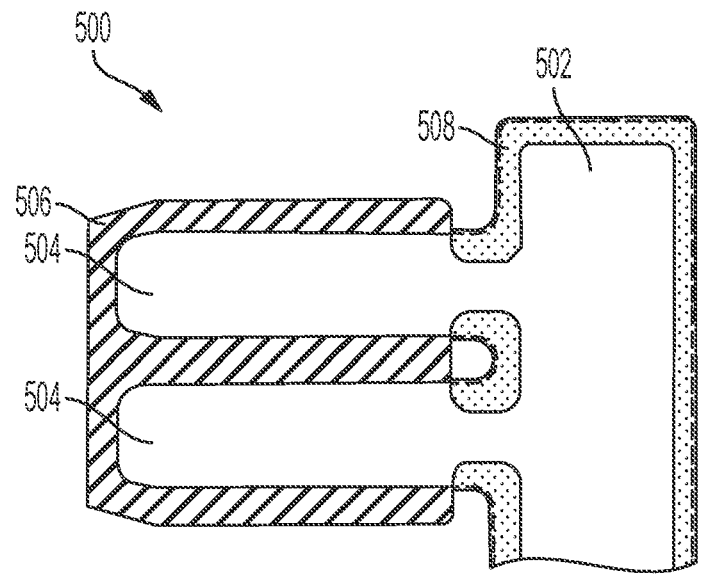
FIGS. 5 and 6 are respective plan and perspective views of a microspring according to an example embodiment.
Figure 6:
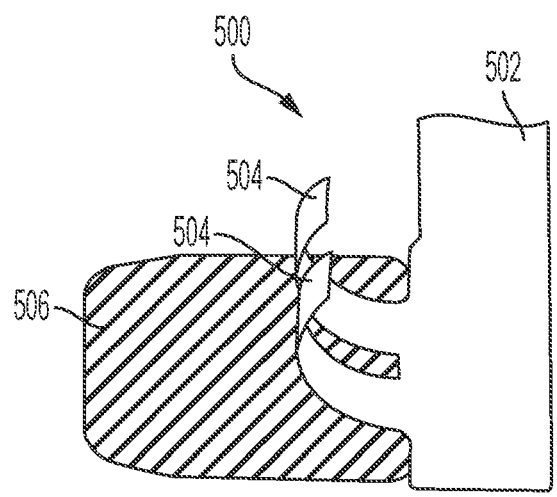

The plan view in FIG. 5 shows an example of a Nb based microspring 500 before released from surfaces. The microspring pattern, which includes a base 502 and spring members 504, are defined by selective etching Au and Nb layers, which exposes a Ti release layer 506 underneath the spring members 504. Photoresist anchors 508 surround the perimeter of the base 502. In the figure, hidden edges of the microspring base 502 are shown with dotted lines. During the release process when the Ti release layers 506 are undercut etched, the photoresist anchors 508 are used to control the profile of spring member 504 released from surface. The photoresist anchors 508 will be stripped after microsprings are released. A perspective view of the released microspring 500 is shown in FIG. 6.

Due to difference of mechanical properties and stress level between MoCr and Nb, the Nb springs exhibit different profiles. Compared with Mo or Cr, Nb is softer metal with high level of ductility (see Table 1). Thus, with same dimension and similar stress in the film, Nb springs can be released with a greater lift height than that of MoCr springs.

TABLE 1

Comparison of modulus of elasticity of bulk Nb, Mo and Nb

| Bulk Materials | Nb | Mo | Cr |
|---|---|---|---|
| Modulus of elasticity (GPa) | 105 | 330 | 248 |

Figure 7:
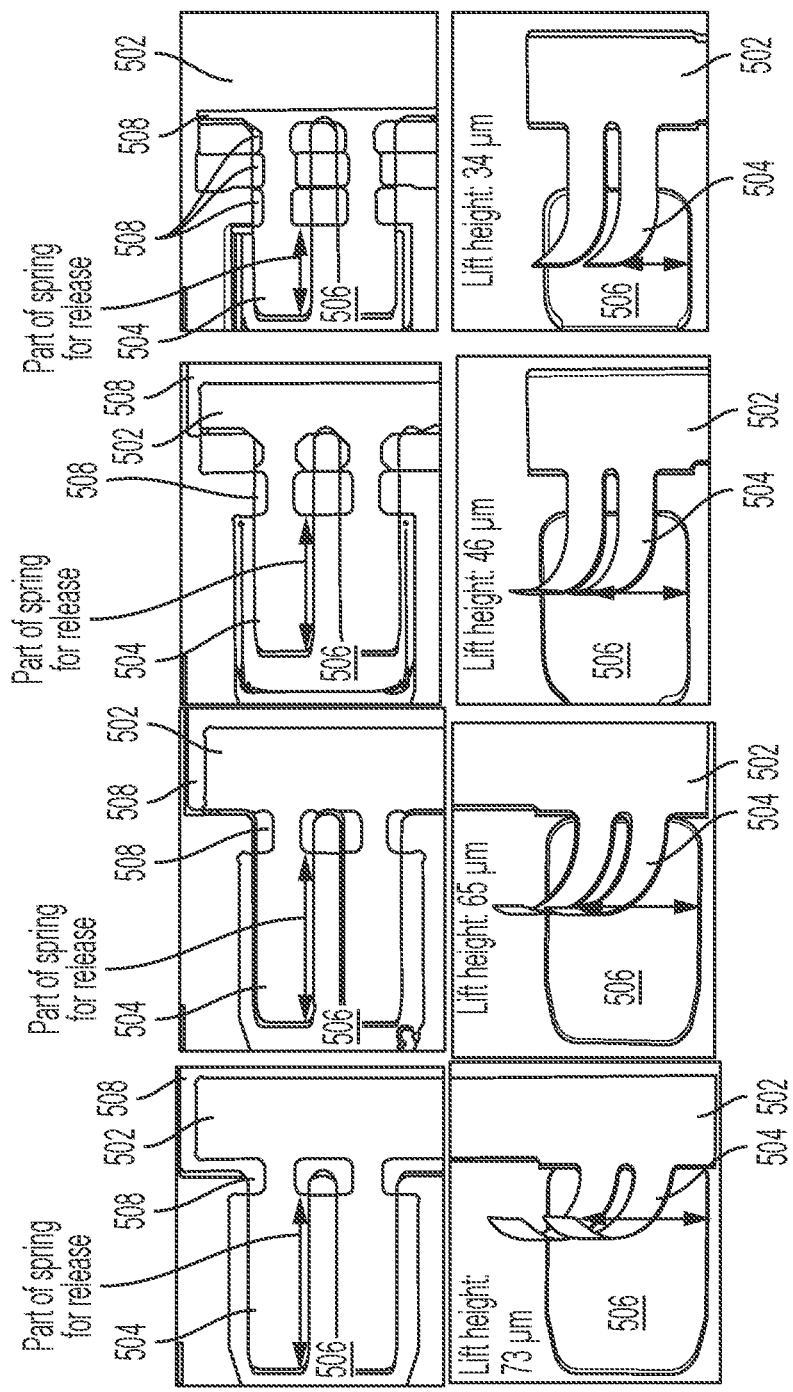
FIG. 7 is a set of diagrams showing effects of geometry on spring height according to various embodiments.
Figure 8:
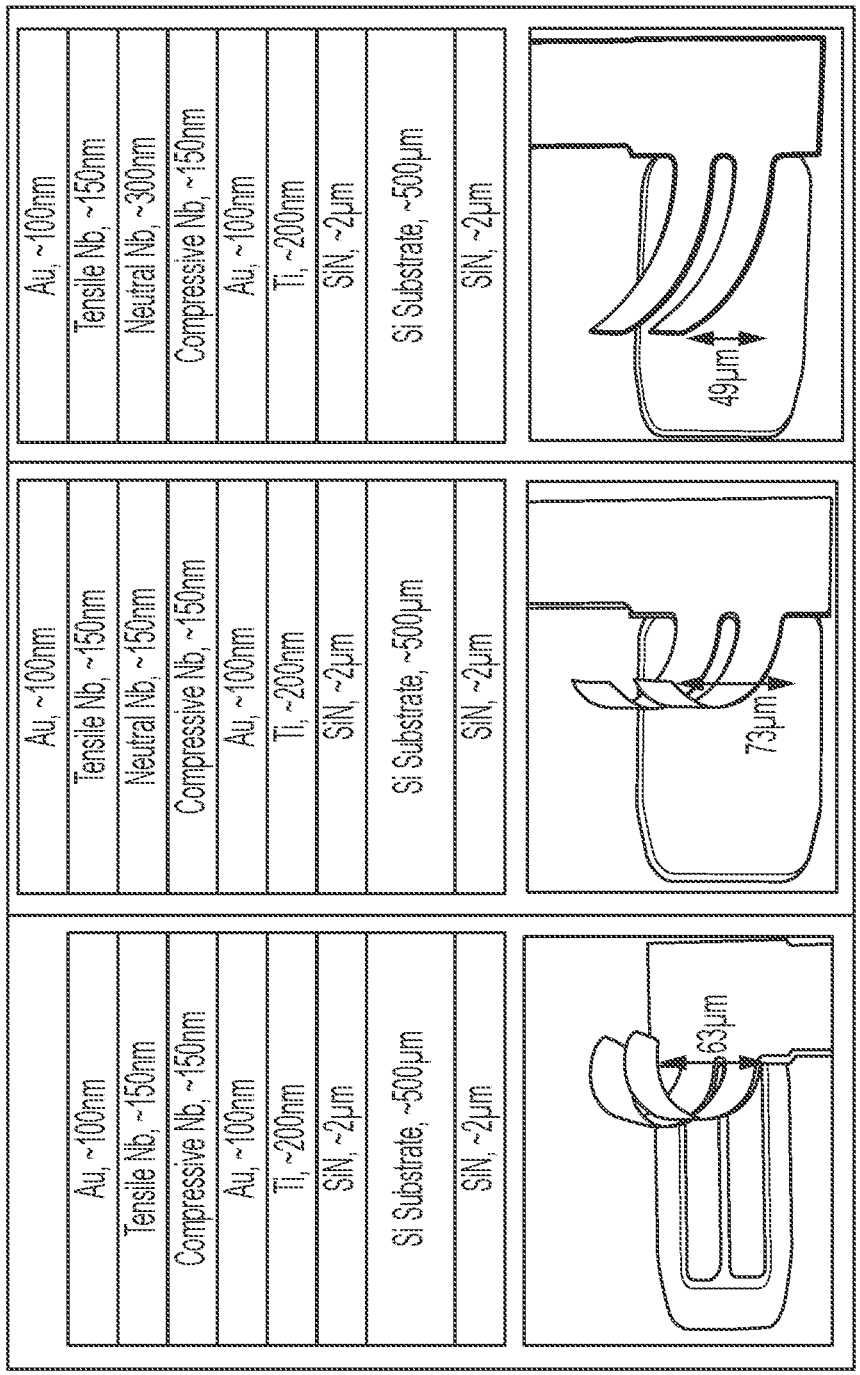
FIG. 8 is a set of diagrams showing effects of stack composition on microspring height according to various embodiments.

In FIGS. 7-8, design and process parameters are shown that facilitate controlling or optimizing the profile of Nb springs. First, with certain thickness and stress level of film stack, the profile of the micro-springs can be well controlled by dimension and shape in spring design. This could provide flexibility for engineering application of the micro-springs. As shown in the images of FIG. 7, the profile of springs (e.g., lift height and shape of the released spring member 504) can be controlled through setting the length of the released part of the springs. The length of the released part of the spring member 504 can be controlled by adjusting the position of photoresist anchor 508 as seen in the top row of diagrams, which are based on SEM images. The photoresist anchor 508 covers at least some of the spring member 504, and greater the coverage of the photoresist anchor 508 over the spring member 504 near the base 502 results in lower lift (and vice versa). It is found that the profile of springs and lift height (from tip of spring to the base of substrate) can be precisely controlled through the position of photoresist anchors 508.

Also note that the release layer 506 and spring member 504 in these examples have different values of overlap. This can also be used to control the length of the part of the spring member 504 that gets released due to the under etching, which affects lift height and shape of the spring member 504 after release. For example, a smaller overlap between the spring member 504 away from the base 502 and release layer 506 results in lower lift (and vice versa). Generally, the release layer 506 overlap and the photoresist anchor 508 positions are changed together to control the microspring profile.

In FIG. 8, a diagram of stack configurations and perspective views of spring structures show the effects of layer configurations. In a stress engineered MoCr film for springs, a sharp transition from high compressive stress to high tensile stress is used to get enough force for spring release from surface. However, in stress engineered Nb film, it is found that a sharp transition results formation of coils as seen in the leftmost pane of FIG. 8. While such Nb microcoils could be useful in application such as 3D radio frequency antennas, typically such shapes are not used for interconnects.

Figure 9:
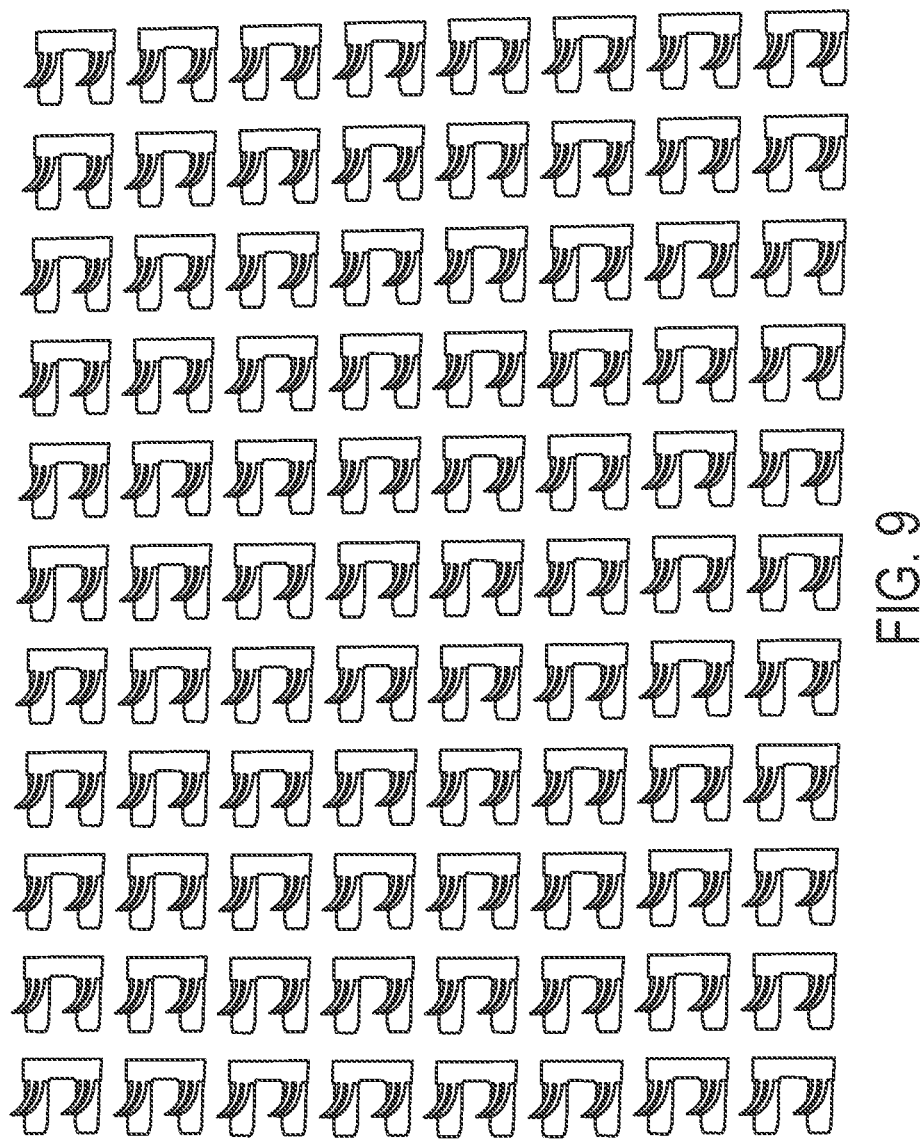
FIG. 9 is a diagram of an array of fabricated microsprings according to an example embodiment.

In order to prevent excessive curling of the spring portions, Nb neutral layer (referred to elsewhere herein as the substantially stress-free layer) with very low stress as transition layer in between compressive layer and tensile layer (see layer 408 in FIG. 4). It is found that the thickness of the neutral Nb layer is has a large influence on the profile of the springs. For example, the thickness of the neutral layer may greater the thicknesses of the compressive and tensile layers by a factor of 1.5 or more, e.g., a factor of at least 2. By using the indicated layer thickness ratios of the neutral layer, as seen in the Nb spring in the right-hand pane of FIG. 8, the Nb spring can have the same profile as a MoCr spring. Tailoring of the neutral Nb layer can be used to optimize and stabilize the micro-spring with enhanced stiffness in whole springs to make high quality, uniform, array of springs, as shown in the SEM image of FIG. 9.

The neutral or substantially stress-free layer in our spring design has a higher $T_c$ than either tensile or compressively stressed layer. The measurement result of $T_c$ in Nb film with different types of stress is shown in Table 2. This allows the neutral layer of the Nb film to carry current at a higher cryogenic temperature than the outer layers.

TABLE 2

Superconductive critical temperature (Tc)
in Nb with different intrinsic stress

| Stress in Nb film | Neutral | High Tensile | High Compressive |
|---|---|---|---|
| $T_c$ (K) | 9.2 | 8.0 | 8.0 |

Figure 10:
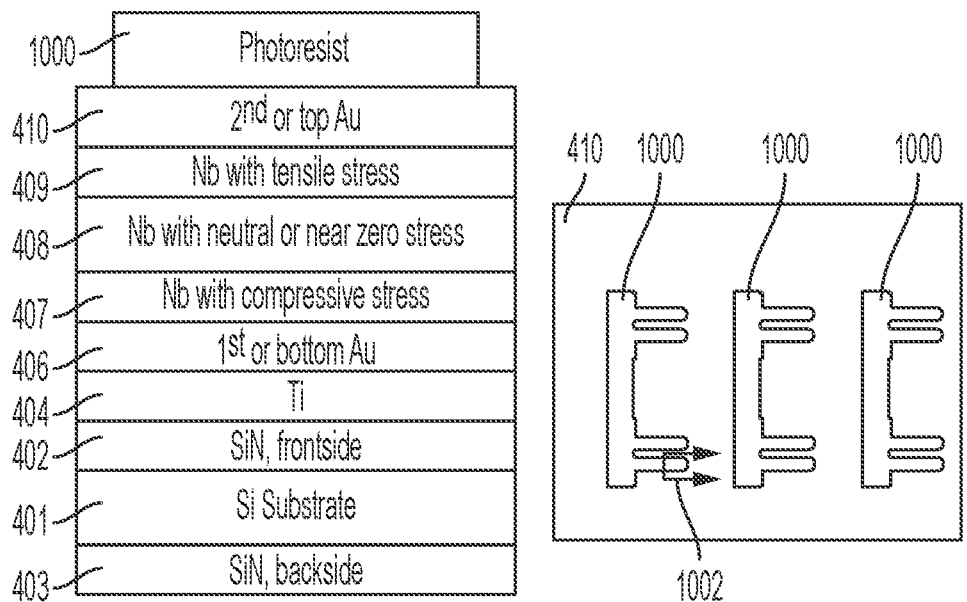
FIGS. 10-15 are block diagrams showing manufacturing steps for a microspring according to an example embodiment.
Figure 11:
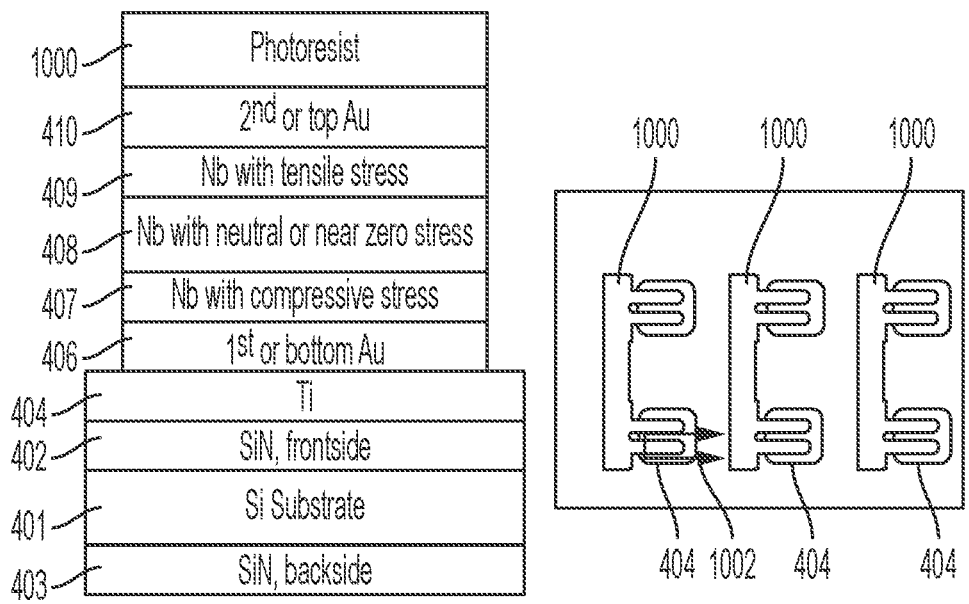
Figure 12:
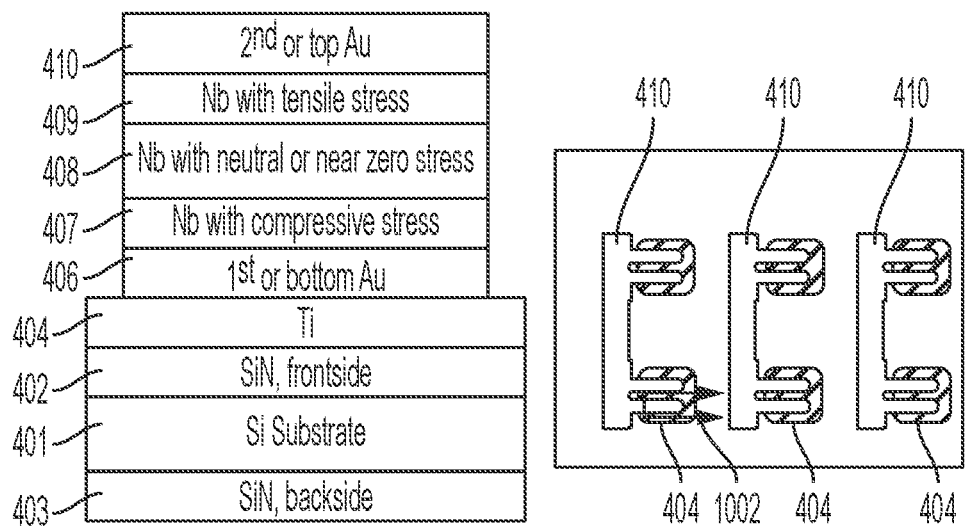

In FIGS. 10-15, block diagrams show additional details of manufacture of microsprings according to an example embodiment. In these figures, a cross sectional view is shown on the left side of each figure and a plan view on the right side of each figure. In FIG. 10, the stack of materials from FIG. 4 is shown on the left side, with a photoresist 1000 patterned as shown on the right side of the figure. The left side cross-section in FIGS. 10-12 correspond to the section line 1002 seen in the right hand side of the figures, which passes through the end of a spring member. In FIG. 11, a shaping etch has been performed through the spring stack layers 406-410 around the photoresist 1000, resulting in a shape of the spring structure corresponding to the photoresist 1000 pattern and leaving the sacrificial Ti layer 404 exposed. In FIG. 12, the photoresist 1000 is removed, leaving the top Au layer 410 of the microspring exposed.

Figure 13:
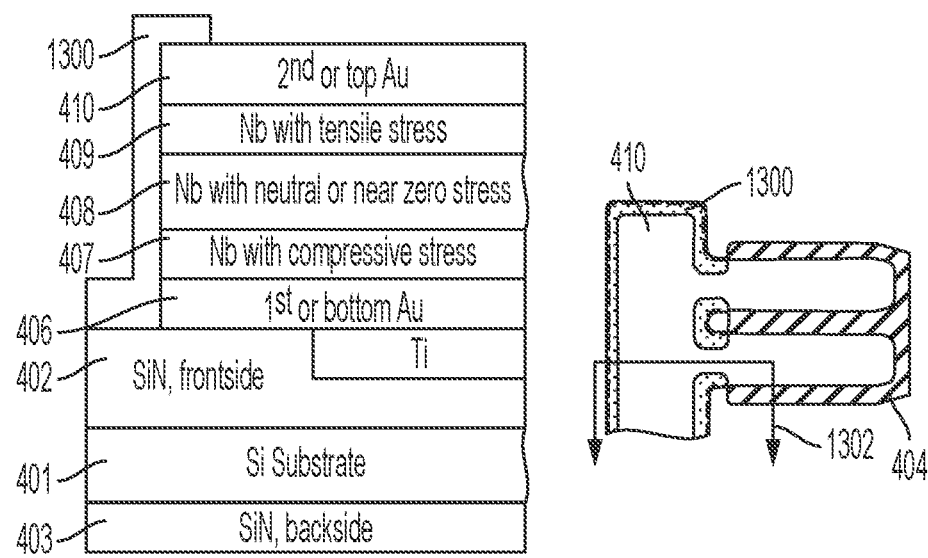
Figure 14:
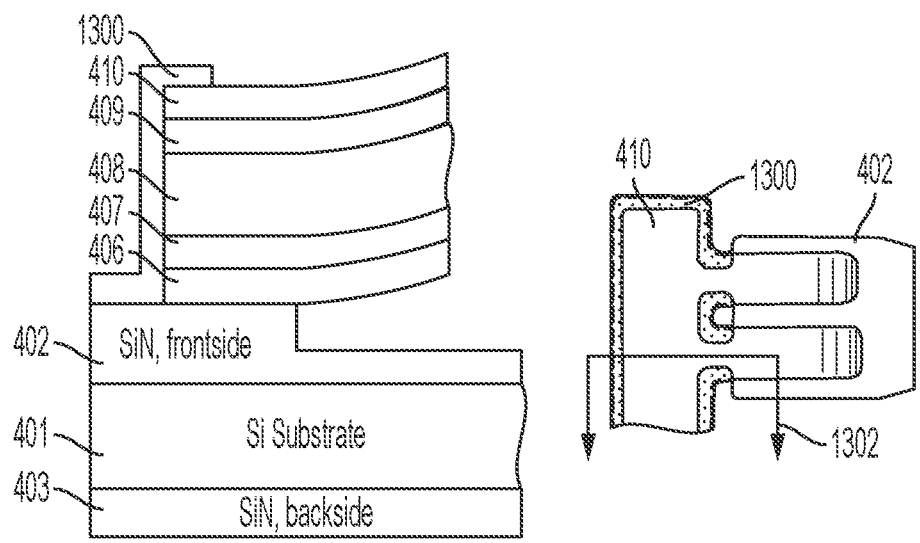
Figure 15:
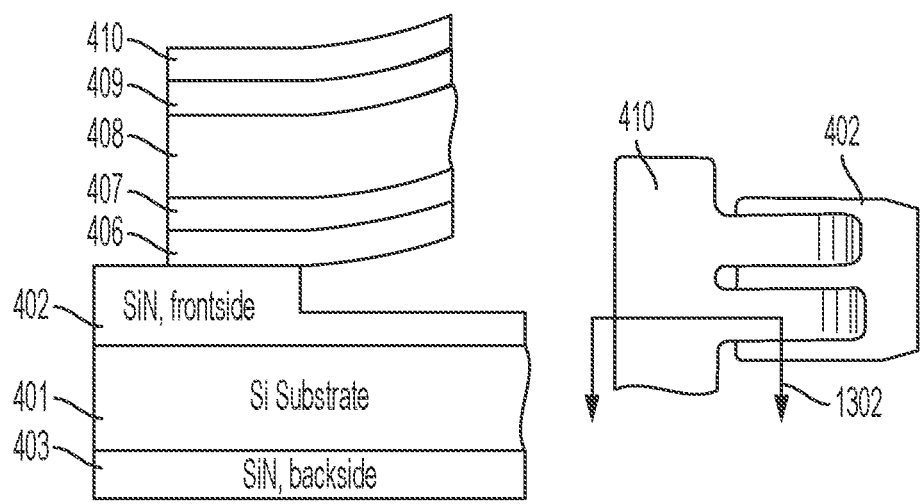

In FIG. 13, a photoresist anchor 1300 is applied around a perimeter of the base portion of the microspring. The photoresist anchor 1300 may also extend over some parts of the spring member near the base depending on the desired shape. Note that the cross-section views in the left side of FIGS. 13-15 corresponds to section line 1302 on the right side of FIG. 13. In FIG. 14, the Ti sacrificial layer 404 is etched away, freeing the end of the spring portion. In FIG. 15, the photoresist anchor 1300 is removed, resulting in a manufactured microspring that can be put into use.

Figure 16:
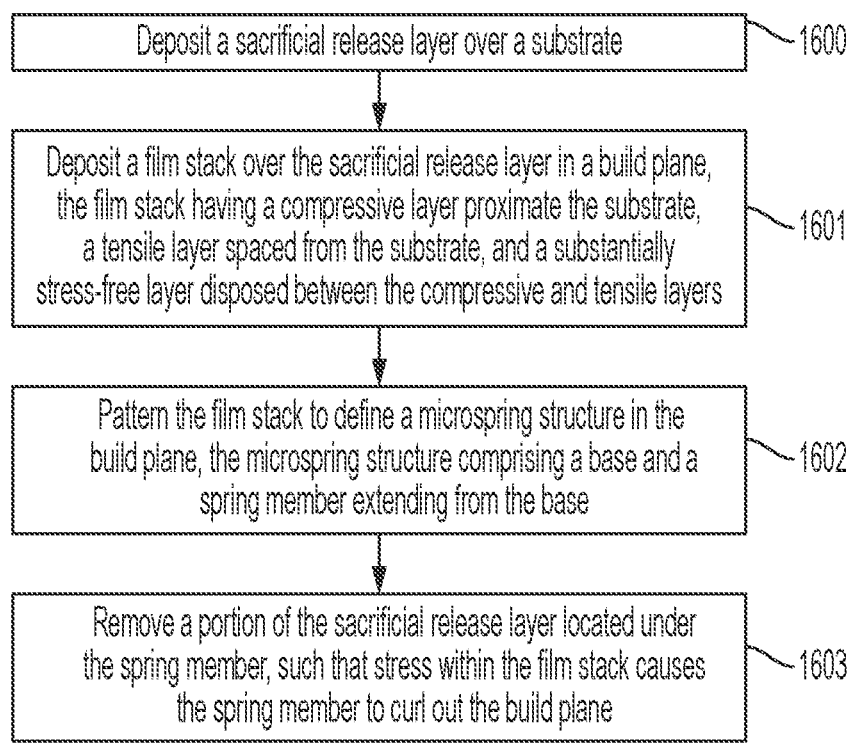
FIG. 16 is a flowchart of a method according to an example embodiment.

In FIG. 16, a flowchart shows a method according to an example embodiment. The method involves depositing 1600 a sacrificial release layer over a substrate. A film stack is deposited 1601 over the sacrificial release layer in a build plane. The film stack includes a compressive layer proximate the substrate, a tensile layer spaced from the substrate, and a substantially stress-free layer disposed between the compressive and tensile layers. The film stack is formed of one or more materials that become superconducting below 100 K. The film stack is patterned 1602 to define a microspring structure in the build plane. The microspring structure includes a base and a spring member extending from the base. A portion of the sacrificial release layer located under the spring member is removed 1603 such that stress within the film stack causes the spring member to curl out of the build plane.

Figure 17:
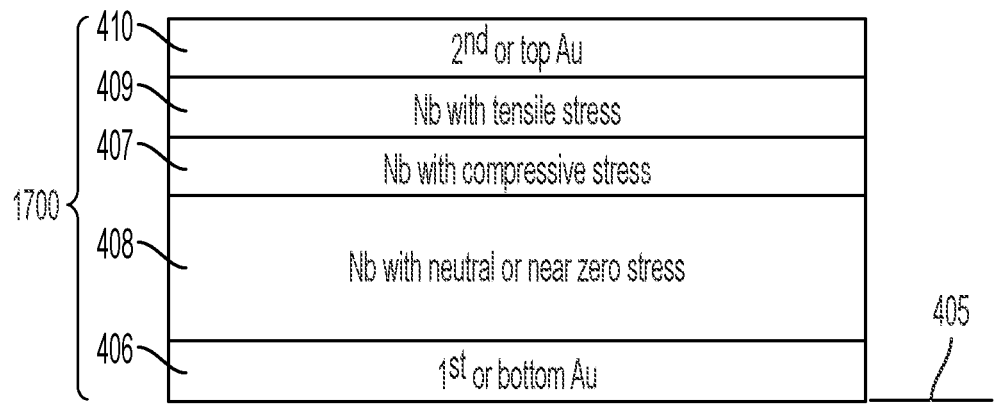
FIGS. 17 and 18 are diagrams of material stacks for a microspring according to other example embodiments.
Figure 18:
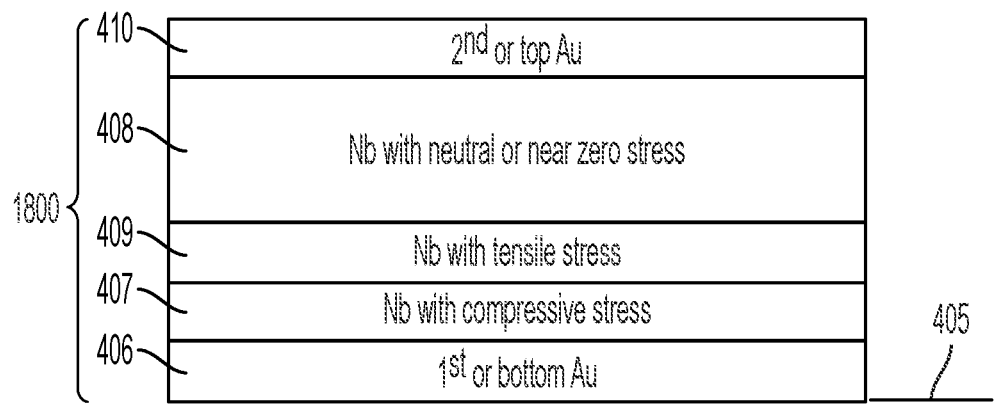

The examples above show a substantially stress-free layer being sandwiched between the compressive and tensile layers. This arrangement can be obtained by varying chamber pressure from low to high pressure as seen in FIG. 3 during spring material deposition. However, other arrangements of the substantially stress-free layer, the compressive layer, and the tensile layer can provide similar mechanical performance. The diagrams in FIGS. 17 and 18 show two alternate stack structures 1700, 1800 according to example embodiments. These figures use the same reference numbers as in FIG. 4 and show the structures from the build surface 405 up. Everything below the build surface may be the same as in FIG. 4 for these examples.

The structure 1700 in FIG. 17 includes a first/bottom conductive layer 406, and a substantially stress-free layer 408 that is below a compressive layer 407 and a tensile layer 409 relative to the build surface 405. The structure 1800 in FIG. 18 includes a first/bottom conductive layer 406, a substantially stress-free layer 408 that is above compressive and tensile layers 407, 409 relative to the build surface 405. In both structures 1700, 1800, a second/top conductive layer 410 is on the top of the stack.

For both structures 1700, 1800, the layers 407-409 are shown as discrete layers, although there may be a smooth transition between the layers 407-409. If a sharp transition is desired between the adjacent compressive layer 407 and tensile layer 409, then deposition (e.g., sputtering) may be halted while chamber pressure is adjusted, then restarted once the desired pressure is obtained. A similar process may be used between the substantially stress-free layer 408 and its adjacent tensile or compressive layer. Through optimization of parameters of film such as stress/thickness and proper dimension and shape in the design, microsprings with these structures 1700, 1800 can achieve a desired lift height above the build surface 405. Also note that in any of the embodiments shown above, the locations of the compressive layer 407 and tensile layer 409 may be swapped, such that the spring curves inwardly away from the build surface 405 (e.g., into a cavity in the build surface 405 formed through the release layer and/or substrate) instead of curving away outwardly as shown. An example of an inward curving spring structure is shown, for example, in FIG. 7 of U.S. Pat. No. 11,201,275, dated Dec. 14, 2021.

In summary, embodiments describe herein include structures and methods that enable fabrication of superconductor-compatible microsprings, e.g., Au—Nb—Au. Other materials may be used to achieve similar results, including spring materials that induce minimal magnetic fields at temperatures in a cryogenic range, e.g., below about 10° K. Manufacturing and design parameters are described that control the profile of the microsprings.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A structure, comprising:
   a microspring comprising a film stack having a base disposed on a build surface and a spring member extending from the base; and
   the film stack comprising a compressive layer, a substantially stress-free layer, and a tensile layer, the film stack formed of one or more materials that become superconducting below 140 K;
   wherein a stress gradient in the film stack causes the spring member to curl away from the build surface of the base.

2. The structure of claim 1, wherein the substantially stress-free layer is sandwiched between the compressive layer and the tensile layer.

3. The structure of claim 1, wherein the substantially stress-free layer is above the compressive layer and the tensile layer relative to the build surface.

4. The structure of claim 1, wherein the substantially stress-free layer is below the compressive layer and the tensile layer relative to the build surface.

5. The structure of claim 1, wherein the compressive layer, the substantially stress-free layer, and the tensile layer are formed of Nb.

6. The structure of claim 1, comprising a top Au layer and a bottom Au layer, wherein the film stack is disposed between the top and bottom Au layers.

7. The structure of claim 1, wherein a lift height by which the spring member curls away from the build surface of the base is a controlled by a thickness of the substantially stress-free layer.

8. The structure of claim 1, wherein the substantially stress-free layer has a thickness greater than a thickness of the compressive layer and a thickness of the tensile layer.

9. The structure of claim 8, wherein the substantially stress-free layer has a higher critical temperature than the compressive and tensile layers.

10. The structure of claim 1, wherein the microspring is disposed on a prefabricated cryogenic electronic device or a superconductive quantum computing device.

11. A structure, comprising:
   a microspring disposed on a build surface and comprising a film stack with a base and a spring member extending from the base; and
   the film stack comprising, in order from the build surface:
      a compressive layer having a first thickness;
      a substantially stress-free layer having a second thickness; and
      a tensile layer having a third thickness, wherein the second thickness is greater than the first and third thicknesses;
   wherein a stress gradient in the film stack causes the spring member to curl away from the build surface of the base.

12. The structure of claim 11, wherein the compressive layer, the substantially stress-free layer, and the tensile layer are formed of Nb.

13. The structure of claim 11, wherein the substantially stress-free layer has a higher critical temperature than the compressive and tensile layers.

14. The structure of claim 11, wherein the microspring is disposed on a prefabricated cryogenic electronic device or a superconductive quantum computing device.

15. The structure of claim 11, comprising a top metal layer and a bottom metal layer, wherein the film stack is disposed between the top and bottom metal layers, wherein the top and bottom metal layers comprise gold (Au).

16. A method of forming a microspring structure, comprising:
   depositing a sacrificial release layer over a substrate, the sacrificial release layer defining a build surface;
   depositing a film stack over the sacrificial release layer, the film stack comprising a compressive layer proximate the substrate, a tensile layer spaced from the substrate, and a substantially stress-free layer disposed between the compressive and tensile layers, the film stack formed of one or more materials that become superconducting below 140 K;
   patterning the film stack to define the microspring structure on the build surface, the microspring structure comprising a base and a spring member extending from the base; and
   removing a portion of the sacrificial release layer located under the spring member, such that stress within the film stack causes the spring member to curl out of the build surface.

17. The method of claim 16, wherein the compressive layer, the substantially stress-free layer, and the tensile layer are formed of Nb.

18. The method of claim 16, further comprising patterning a photoresist layer over an edge of the base and a portion of the spring member near the base, wherein a profile of the spring member is controlled by:
   selection of a size of the portion of the spring member near the base that is covered by the photoresist layer; and
   selection of an overlap between the sacrificial release and the spring member away from the base.

19. The method of claim 16, wherein the depositing of the film stack comprises varying a deposition pressure in a sputtering chamber to induce intrinsic compressive, neutral, and tensile stresses respectively in the compressive layer, the substrate, the tensile layer, and the substantially stress-free layer.

20. The method of claim 16, wherein the substantially stress-free layer has a higher critical temperature than the compressive and tensile layers.

* * * * *